US008024854B2

(12) United States Patent
Lu et al.

(10) Patent No.: US 8,024,854 B2

(45) Date of Patent: Sep. 27, 2011

(54) AUTOMATED SOLAR CELL ELECTRICAL CONNECTION APPARATUS

(75) Inventors: Danny Cam Toan Lu, San Francisco, CA (US); Jeffrey S. Sullivan, Castro Valley, CA (US); David Tanner, San Jose, CA (US); Yacov Elgar, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 231 days.

(21) Appl. No.: 12/358,844

(22) Filed: Jan. 23, 2009

(65) Prior Publication Data

US 2009/0188102 A1 Jul. 30, 2009

Related U.S. Application Data

(60) Provisional application No. 61/023,810, filed on Jan. 25, 2008.

(51) Int. Cl.

| | |
|---|---|
| ***B23P 19/00*** | (2006.01) |
| ***B23P 21/00*** | (2006.01) |
| ***B23P 23/00*** | (2006.01) |
| ***B23Q 15/00*** | (2006.01) |
| ***B23Q 41/00*** | (2006.01) |

(52) U.S. Cl. ................ 29/739; 29/742; 29/707; 29/564; 29/564.1

(58) Field of Classification Search .................... 29/840, 29/739, 742, 707, 709, 564, 564.1

See application file for complete search history.

(56) References Cited

U.S. PATENT DOCUMENTS 4,371,739 A * 2/1983 Lewis et al. .................. 136/251
4,534,502 A * 8/1985 Piurek ........................... 228/102

(Continued)

FOREIGN PATENT DOCUMENTS

JP 2001-223382 8/2001

(Continued)

OTHER PUBLICATIONS

Paul A. Basore. "Large-Area Deposition for Crystalline Silicon on Glass Modules", May 2003. pp. 1-4.

(Continued)

*Primary Examiner* — A. Dexter Tugbang
*Assistant Examiner* — David Angwin
(74) *Attorney, Agent, or Firm* — Patterson & Sheridan, L.L.P.

(57) ABSTRACT

The present invention generally relates to an automated solar cell electrical connection device that is positioned within an automated solar cell fabrication system. The automated solar cell electrical connection device includes a module and process for automatically attaching a junction box to a composite solar cell structure during the fabrication of a completed solar cell device. The automated solar cell electrical connection module may include a composite solar cell structure conveyor for positioning the composite solar cell structure, an adhesive dispense module for applying adhesive to the junction box, a flux dispenser for applying flux to electrical connection tabs in the junction box, a vision system for locating features on the composite solar cell structure, a robot for positioning the junction box onto the composite solar cell structure, a heating element to make electrical connections between the junction box and the solar cell device, a potting material dispensing assembly for dispensing potting material into the junction box, and a system controller for controlling the functions of the module.

9 Claims, 10 Drawing Sheets

U.S. PATENT DOCUMENTS

| | | | | |
|---|---|---|---|---|
| 4,773,944 | A * | 9/1988 | Nath et al. | 136/249 |
| 5,110,369 | A * | 5/1992 | Tornstrom et al. | 136/251 |
| 5,258,077 | A * | 11/1993 | Shahryar | 136/256 |
| 6,077,722 | A * | 6/2000 | Jansen et al. | 438/74 |
| 6,143,976 | A * | 11/2000 | Endros | 136/256 |
| 6,288,325 | B1 * | 9/2001 | Jansen et al. | 136/249 |
| 6,429,037 | B1 * | 8/2002 | Wenham et al. | 438/57 |
| 6,437,236 | B2 * | 8/2002 | Watanabe et al. | 136/251 |
| 6,476,314 | B2 * | 11/2002 | Bauman et al. | 136/256 |
| 6,784,361 | B2 * | 8/2004 | Carlson et al. | 136/258 |
| 6,841,728 | B2 * | 1/2005 | Jones et al. | 136/244 |
| 6,870,087 | B1 * | 3/2005 | Gallagher | 136/246 |
| 6,960,716 | B2 * | 11/2005 | Matsumi et al. | 136/244 |
| 7,238,879 | B2 * | 7/2007 | Matsushita et al. | 136/251 |
| 7,432,439 | B2 * | 10/2008 | Takada et al. | 174/50 |
| 2003/0044539 | A1 * | 3/2003 | Oswald | 427/404 |
| 2005/0072455 | A1 * | 4/2005 | Gerhardinger et al. | 136/243 |
| 2005/0161080 | A1 * | 7/2005 | Nieleck et al. | 136/293 |
| 2006/0289053 | A1 * | 12/2006 | Nieleck et al. | 136/244 |
| 2009/0108605 | A1 * | 4/2009 | Becker et al. | 294/88 |

FOREIGN PATENT DOCUMENTS

| | | |
|---|---|---|
| WO | WO 2008/092186 | 8/2008 |

OTHER PUBLICATIONS

PCT International Search Report and Written Opinion dated Jul. 29, 2009 for International Application No. PCT/US2009/031843.

* cited by examiner

200

AUTOMATED SOLAR CELL ELECTRICAL CONNECTION APPARATUS

CROSS-REFERENCE TO RELATED APPLICATIONS

This application claims benefit of U.S. provisional patent application Ser. No. 61/023,810, filed Jan. 25, 2008, which is herein incorporated by reference.

This application is related to U.S. application Ser. No. 12/202,199, filed Aug. 29, 2008 and U.S. application Ser. No. 12/201,840, filed Aug. 29, 2008.

BACKGROUND OF THE INVENTION

1. Field of the Invention

Embodiments of the present invention generally relate to the design and layout of a module used in a solar cell production line. Embodiments of the present invention also generally relate to an apparatus and processes that are useful for forming electrical connections in a solar cell device.

2. Description of the Related Art

Photovoltaic (PV) devices or solar cells are devices which convert sunlight into direct current (DC) electrical power. Typical thin film PV devices, or thin film solar cells, have one or more p-i-n junctions. Each p-i-n junction comprises a p-type layer, an intrinsic type layer, and an n-type layer. When the p-i-n junction of the solar cell is exposed to sunlight (consisting of energy from photons), the sunlight is converted to electricity through the PV effect. Solar cells may be tiled into larger solar arrays. The solar arrays are created by connecting a number of solar cells and joining them into panels with specific frames and connectors.

Typically, a thin film solar cell includes active regions, or photoelectric conversion units, and a transparent conductive oxide (TCO) film disposed as a front electrode and/or as a back electrode. The photoelectric conversion unit includes a p-type silicon layer, an n-type silicon layer, and an intrinsic type (i-type) silicon layer sandwiched between the p-type and n-type silicon layers. Several types of silicon films including microcrystalline silicon film (μc-Si), amorphous silicon film (a-Si), polycrystalline silicon film (poly-Si), and the like may be utilized to form the p-type, n-type, and/or i-type layers of the photoelectric conversion unit. The backside electrode may contain one or more conductive layers.

With traditional energy source prices on the rise, there is a need for a low cost way of producing electricity using a low cost solar cell device. Conventional solar cell manufacturing processes are highly labor intensive and have numerous interruptions that can affect production line throughput, solar cell cost, and device yield. Conventional solar cell fabrication processes include a number of manual operations that can cause the formed solar cell device properties to vary from one device to another. In typical solar cell electrical connection processes, formed electrical leads are manually positioned within a hosing that is manually bonded to the solar cell. These manual processes are labor intensive, time consuming, and costly. Additionally, as the size of solar cell substrates continues to increase, the floor spacing and number of technicians needed to perform these manual operations increases, resulting in significant overall costs of ownership. Moreover, as the solar cell sizes increase, manually making electrical connections in a central location becomes significantly more difficult. Therefore, a need exists for an automated electrical connection module in a solar cell fabrication system.

SUMMARY OF THE INVENTION

In one embodiment of the present invention, a solar cell electrical connection module comprises a receiving region configured to receive a junction box, a robotic arm disposed adjacent the junction box receiving region configured to hold and manipulate the junction box, an adhesive dispense assembly configured to apply an adhesive to a sealant surface of the junction box, a vision system configured to scan a solar cell device and locate positional features on the solar cell device, a robotic gripper having gripping elements configured to pick up, manipulate, and place the junction box assembly onto the solar cell device, a heating element configured to create an electrical connection between the junction box and the solar cell device, and a system controller configured to receive signals from the vision system and send signals to the robotic gripper.

In another embodiment, a solar cell electrical connection module comprises a junction box conveyor positioned to receive a junction box from an outside source and deliver the junction box to a junction box receiving region of the module, a robotic arm positioned to receive the junction box from the junction box receiving region of the module and position the junction box for receiving adhesive from an adhesive dispensing module, a head assembly supported by a gantry, wherein the gantry is located above a solar cell device conveyor, wherein the head assembly comprises a vision system, a robotic gripper, and a heating assembly, an actuator attached to the head assembly configured to move the head assembly in a first direction, and a system controller configured to receive signals from the vision system and send signals to the head assembly.

In yet another embodiment of the present invention a method of attaching a junction box to a solar cell device comprises receiving a junction box from a junction box conveyor into a junction box receiving region, retrieving the junction box from the receiving region and manipulating the orientation of the junction box, applying an adhesive to a sealant surface of the junction box, picking up the junction box via a robotic gripper, moving a solar cell device in a first direction via a solar cell device conveyor, scanning the solar cell device with a vision system to locate exposed leads disposed on the solar cell device, moving the junction box in a second direction via a head assembly and an actuator while rotationally reorienting the junction box, positioning the junction box to align electrical connection points within the junction box with the exposed electrical leads on a solar cell device via information provided by the vision system, placing the junction box onto the solar cell device, positioning a heating element in contact with the electrical connection points using information provided by the vision system, and heating the electrical connection points and the electrical leads to create an electrical connection therebetween.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present invention generally relates to an automated solar cell electrical connection module positioned within an automated solar cell fabrication line. The automated solar cell fabrication line is generally an arrangement of automated processing modules and automation equipment used to form solar cell devices. The automated solar fabrication line generally comprises a substrate receiving module, one or more absorbing layer deposition cluster tools having at least one processing chamber to deposit a silicon-containing layer on a surface of the substrate, one or more back contact deposition chambers to deposit a back contact layer on a surface of the substrate, one or more material removal chambers adapted to remove material from a surface of the substrate, a substrate sectioning module, a module for preparing substrate surfaces and edges (such as an edge deletion module), a solar cell encapsulation device, an autoclave module adapted to heat and expose a composite substrate to a pressure greater than atmospheric pressure, a junction box attaching module to attach a connection element for connecting solar cells to external components, and one or more quality assurance modules adapted to test and qualify the formed solar cell device.

Figure 1:
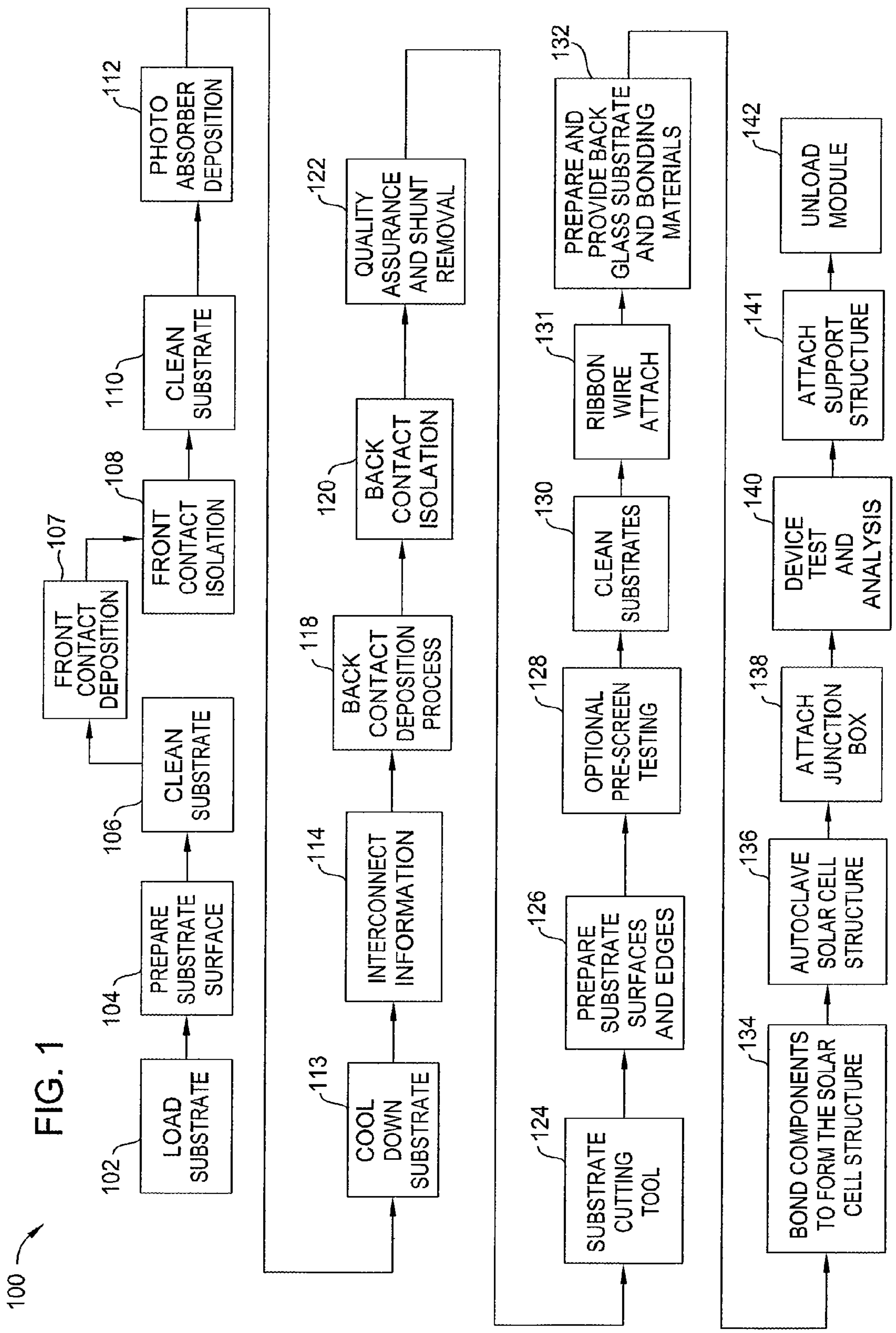
FIG. 1 illustrates a process sequence for forming a solar cell device according to one embodiment described herein.
Figure 2:
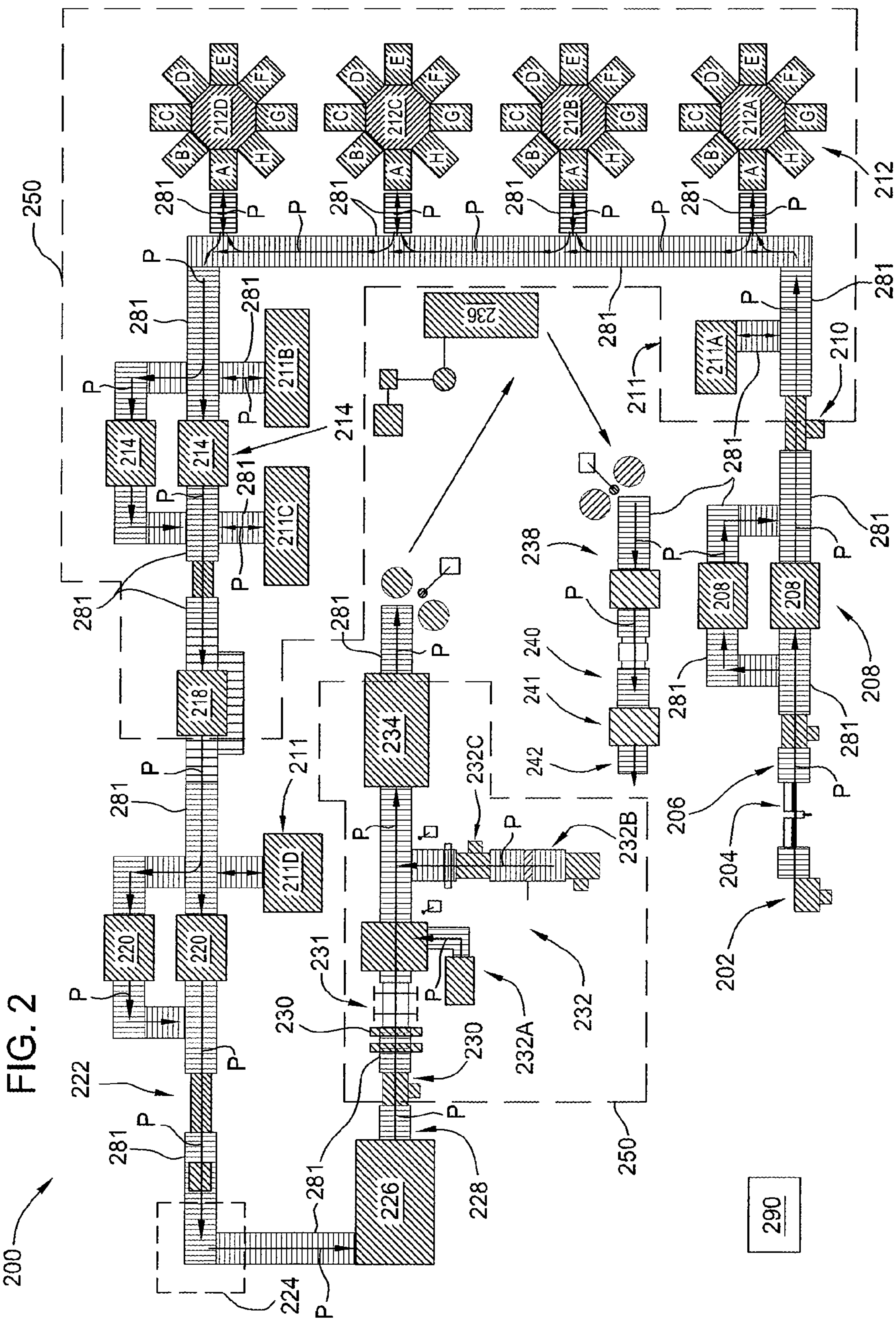
FIG. 2 illustrates a plan view of a solar cell production line according to one embodiment described herein.

FIG. 1 illustrates one embodiment of a process sequence 100 that contains a plurality of steps (i.e., steps 102-142) that are each used to form a solar cell device using a novel solar cell production line 200 described herein. The configuration, number of processing steps, and order of the processing steps in the process sequence 100 is not intended to be limiting to the scope of the invention described herein. FIG. 2 is a plan view of one embodiment of the production line 200, which is intended to illustrate some of the typical processing modules and process flows through the system and other related aspects of the system design, and is thus not intended to be limiting to the scope of the invention described herein.

A system controller 290 may be used to control one or more components found in the solar cell production line 200. The system controller 290 facilitates the control and automation of the overall solar cell production line 200 and typically includes a central processing unit (CPU) (not shown), memory (not shown), and support circuits (or I/O) (not shown). The CPU may be one of any form of computer processors that are used in industrial settings for controlling various system functions, substrate movement, chamber processes, and support hardware (e.g., sensors, robots, motors, lamps, etc.), and monitor the processes (e.g., substrate support temperature, power supply variables, chamber process time, I/O signals, etc.). The memory is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits are also connected to the CPU for supporting the processor in a conventional manner. The support circuits may include cache, power supplies, clock circuits, input/output circuitry, subsystems, and the like.

A program (or computer instructions) readable by the system controller 290 determines which tasks are performable on a substrate. Preferably, the program is software readable by the system controller 290 that includes code to perform tasks relating to monitoring, moving, supporting, and/or positioning of a substrate along with various process recipe tasks and various chamber process recipe steps performed in the solar cell production line 200. In one embodiment, the system controller 290 also contains a plurality of programmable logic controllers (PLC's) that are used to locally control one or more modules in the solar cell production and a material handling system controller (e.g., PLC or standard computer) that deals with the higher level strategic moving, scheduling, and running of the complete solar cell production line.

Figure 3A:
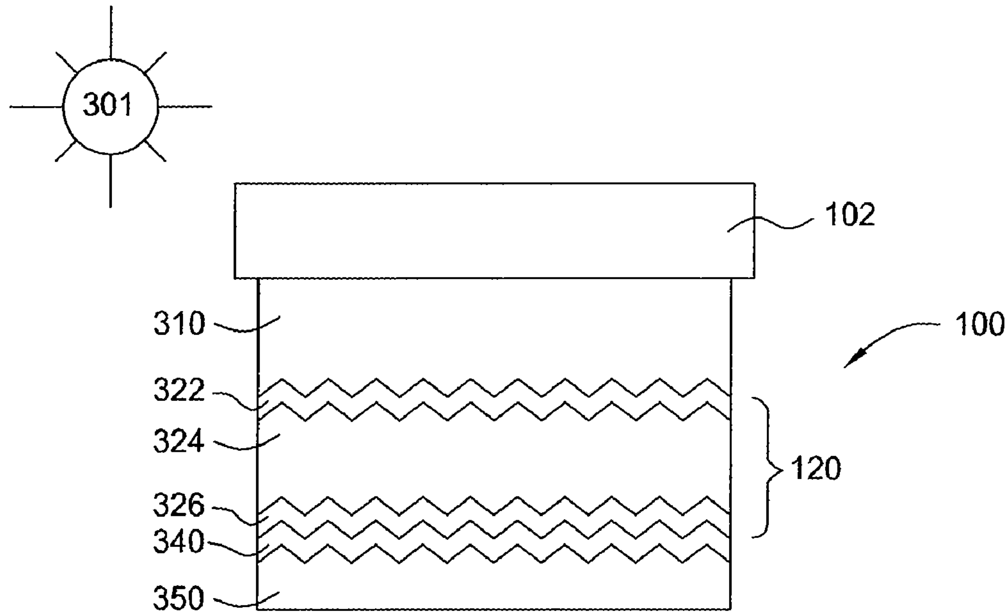
FIG. 3A is a side cross-sectional view of a thin film solar cell device according to one embodiment described herein.

Examples of a solar cell 300 that can be formed and tested using the process sequences illustrated in FIG. 1 and the components illustrated in the solar cell production line 200 are illustrated in FIGS. 3A-3E. FIG. 3A is a simplified schematic diagram of a single junction amorphous or micro-crystalline silicon solar cell 300 that can be formed and analyzed in the system described below.

As shown in FIG. 3A, the single junction amorphous or micro-crystalline silicon solar cell 300 is oriented toward a light source or solar radiation 301. The solar cell 300 generally comprises a substrate 302, such as a glass substrate, polymer substrate, metal substrate, or other suitable substrate, with thin films formed thereover. In one embodiment, the substrate 302 is a glass substrate that is about 2200 mm×2600 mm×3 mm in size. The solar cell 300 further comprises a first transparent conducting oxide (TCO) layer 310 (e.g., zinc oxide (ZnO), tin oxide (SnO)) formed over the substrate 302, a first p-i-n junction 320 formed over the first TCO layer 310, a second TCO layer 340 formed over the first p-i-n junction 320, and a back contact layer 350 formed over the second TCO layer 340. To improve light absorption by enhancing light trapping, the substrate and/or one or more of the thin films formed thereover may be optionally textured by wet, plasma, ion, and/or mechanical processes. For example, in the embodiment shown in FIG. 3A, the first TCO layer 310 is textured, and the subsequent thin films deposited thereover generally follow the topography of the surface below it.

In one configuration, the first p-i-n junction 320 may comprise a p-type amorphous silicon layer 322, an intrinsic type amorphous silicon layer 324 formed over the p-type amorphous silicon layer 322, and an n-type microcrystalline silicon layer 326 formed over the intrinsic type amorphous silicon layer 324. In one example, the p-type amorphous silicon layer 322 may be formed to a thickness between about 60 Å and about 300 Å, the intrinsic type amorphous silicon layer 324 may be formed to a thickness between about 1,500 Å and about 3,500 Å, and the n-type microcrystalline silicon layer 326 may be formed to a thickness between about 100 Å and about 400 Å. The back contact layer 350 may include, but is not limited to, a material selected from the group consisting of Al, Ag, Ti, Cr, Au, Cu, Pt, alloys thereof, and combinations thereof.

Figure 3B:
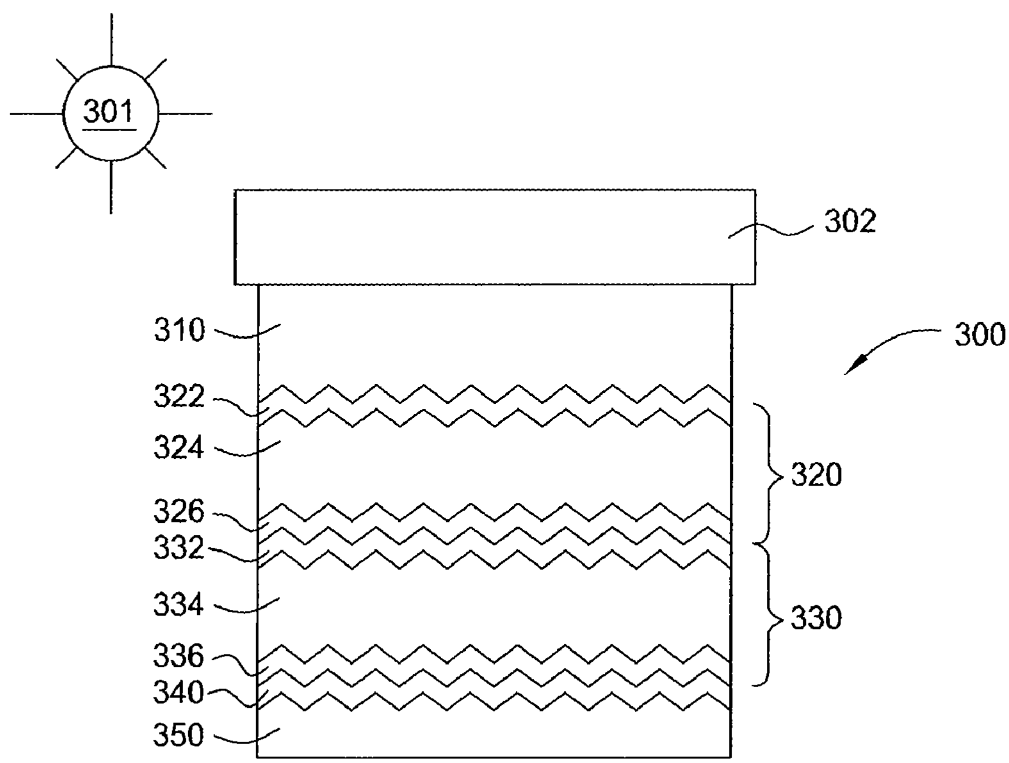
FIG. 3B is a side cross-sectional view of a thin film solar cell device according to one embodiment described herein.

FIG. 3B is a schematic diagram of an embodiment of a solar cell 300, which is a multi-junction solar cell that is oriented toward the light or solar radiation 301. The solar cell 300 comprises a substrate 302, such as a glass substrate, polymer substrate, metal substrate, or other suitable substrate, with thin films formed thereover. The solar cell 300 may further comprise a first transparent conducting oxide (TCO) layer 310 formed over the substrate 302, a first p-i-n junction 320 formed over the first TCO layer 310, a second p-i-n junction 330 formed over the first p-i-n junction 320, a second TCO layer 340 formed over the second p-i-n junction 330, and a back contact layer 350 formed over the second TCO layer 340.

In the embodiment shown in FIG. 3B, the first TCO layer 310 is textured, and the subsequent thin films deposited thereover generally follow the topography of the surface below it. The first p-i-n junction 320 may comprise a p-type amorphous silicon layer 322, an intrinsic type amorphous silicon layer 324 formed over the p-type amorphous silicon layer 322, and an n-type microcrystalline silicon layer 326 formed over the intrinsic type amorphous silicon layer 324. In one example, the p-type amorphous silicon layer 322 may be formed to a thickness between about 60 Å and about 300 Å, the intrinsic type amorphous silicon layer 324 may be formed to a thickness between about 1,500 Å and about 3,500 Å, and the n-type microcrystalline silicon layer 326 may be formed to a thickness between about 100 Å and about 400 Å.

The second p-i-n junction 330 may comprise a p-type microcrystalline silicon layer 332, an intrinsic type microcrystalline silicon layer 334 formed over the p-type microcrystalline silicon layer 332, and an n-type amorphous silicon layer 336 formed over the intrinsic type microcrystalline silicon layer 334. In one example, the p-type microcrystalline silicon layer 332 may be formed to a thickness between about 100 Å and about 400 Å, the intrinsic type microcrystalline silicon layer 334 may be formed to a thickness between about 10,000 Å and about 30,000 Å, and the n-type amorphous silicon layer 336 may be formed to a thickness between about 100 Å and about 500 Å. The back contact layer 350 may include, but is not limited to a material selected from the group consisting of Al, Ag, Ti, Cr, Au, Cu, Pt, alloys thereof, and combinations thereof.

Figure 3C:
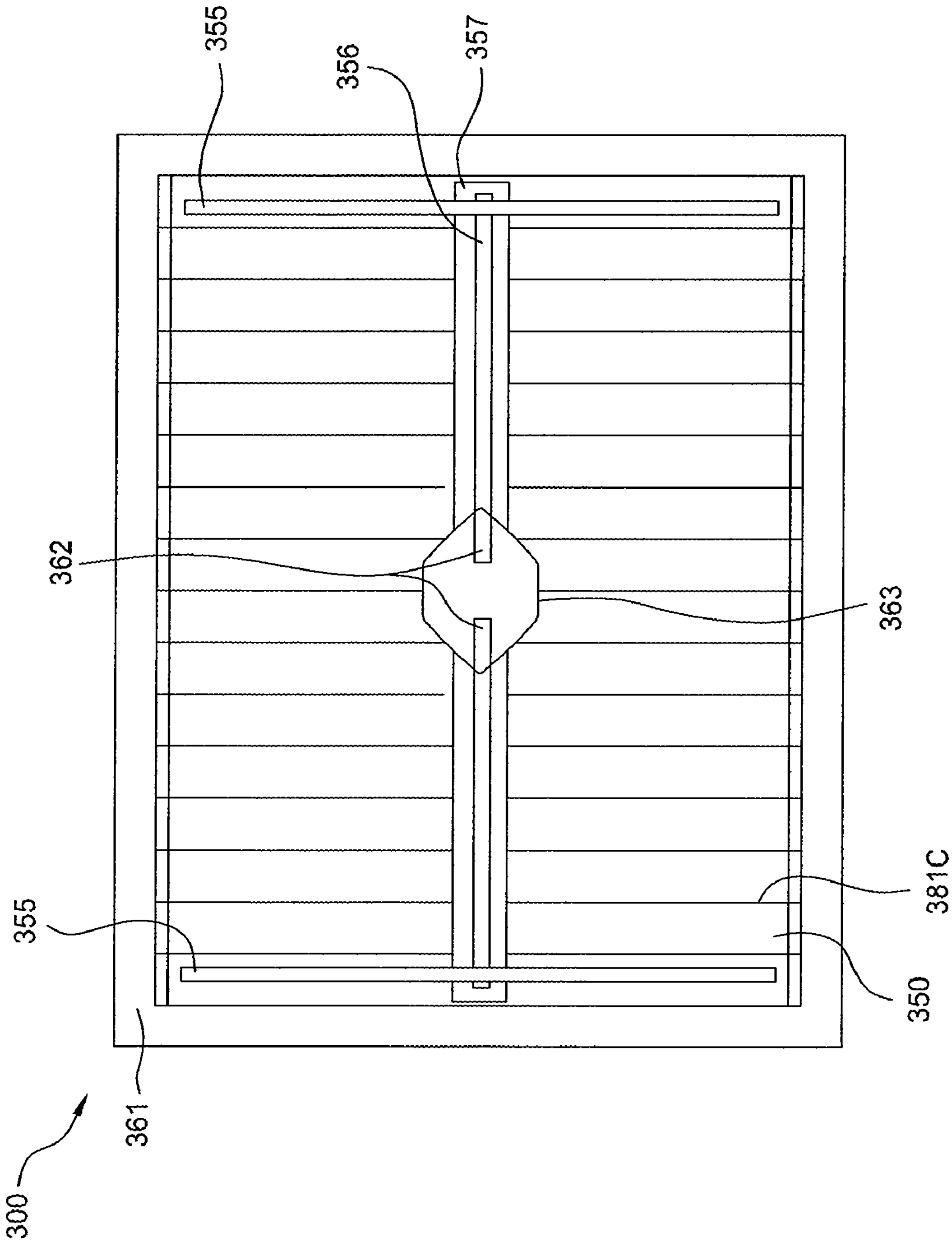
FIG. 3C is a plan view of a composite solar cell structure according to one embodiment described herein.
Figure 3D:
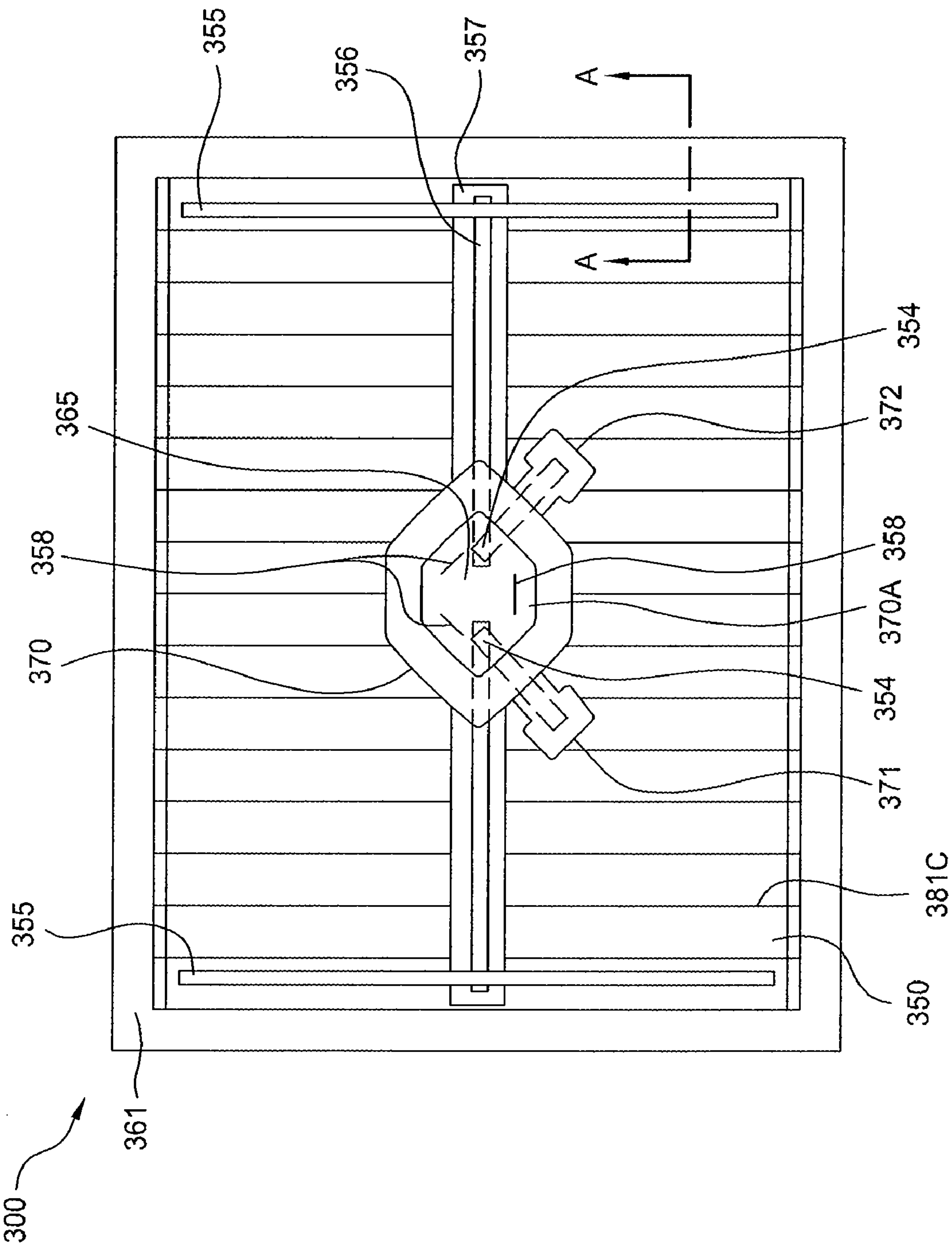
FIG. 3D is a plan view of a thin film solar cell device according to one embodiment described herein.
Figure 3E:
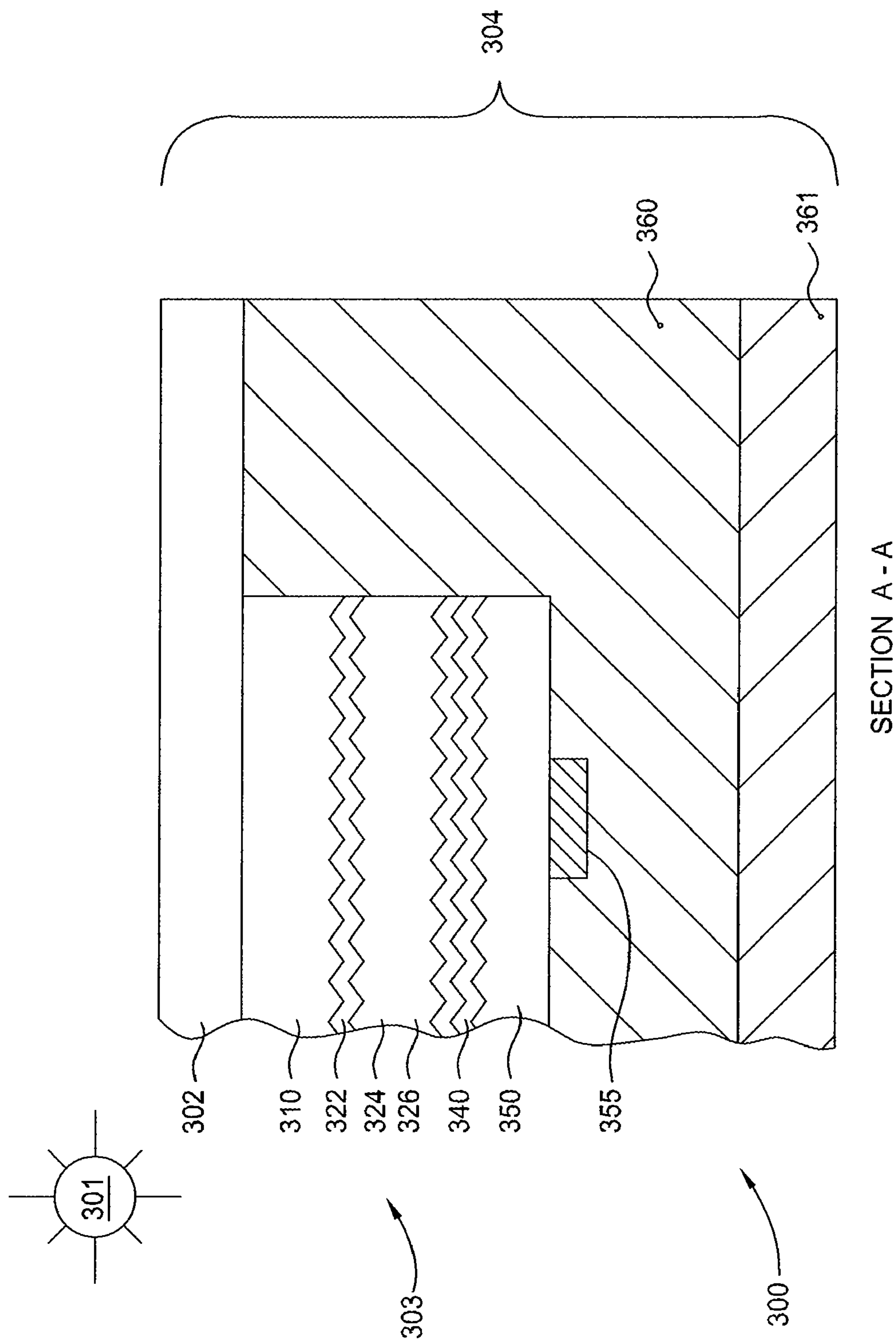
FIG. 3E is a side cross-sectional view along Section A-A of FIG. 3D.

FIG. 3C is a plan view that schematically illustrates an example of the rear surface of a formed solar cell 300 prior to the attachment of a junction box. FIG. 3D is a plan view of the rear surface of the formed solar cell 300, after the attachment of the junction box, which has been produced and tested in the production line 200. FIG. 3E is a side cross-sectional view of a portion of the solar cell 300 illustrated in FIG. 3D (see section A-A). While FIG. 3E illustrates the cross-section of a single junction cell similar to the configuration described in FIG. 3A, this is not intended to be limiting as to the scope of the invention described herein.

As shown in FIGS. 3C, 3D, and 3E, the solar cell 300 may contain a substrate 302, the solar cell device elements (e.g., reference numerals 310-350), one or more internal electrical connections (e.g., side buss 355, cross-buss 356), a layer of bonding material 360, a back glass substrate 361, and a junction box 370 having a lid 370A.

As shown in FIG. 3C, the back glass substrate 361 may include an opening 363 for exposing leads 362 of the cross-buss 356. As shown in FIG. 3D, the junction box 370 may include two junction box terminals 371, 372 with connection points 354 that are electrically connected to the solar cell 300 through the side buss 355 and the cross-buss 356 via leads 362, all of which are in electrical communication with the back contact layer 350 and active regions of the solar cell 300. The junction box 370 may also include datum features 358 for use in locating, placing, and attaching the junction box as subsequently described.

To avoid confusion relating to the actions specifically performed on the substrates 302 in the discussion below, a substrate 302 having one or more of the deposited layers (e.g., reference numerals 310-350) and/or one or more internal electrical connections (e.g., side buss 355, cross-buss 356) disposed thereon is generally referred to as a device substrate 303. Similarly, a device substrate 303 that has been bonded to a back glass substrate 361 using a bonding material 360 is referred to as a composite solar cell structure 304.

Figure 3F:
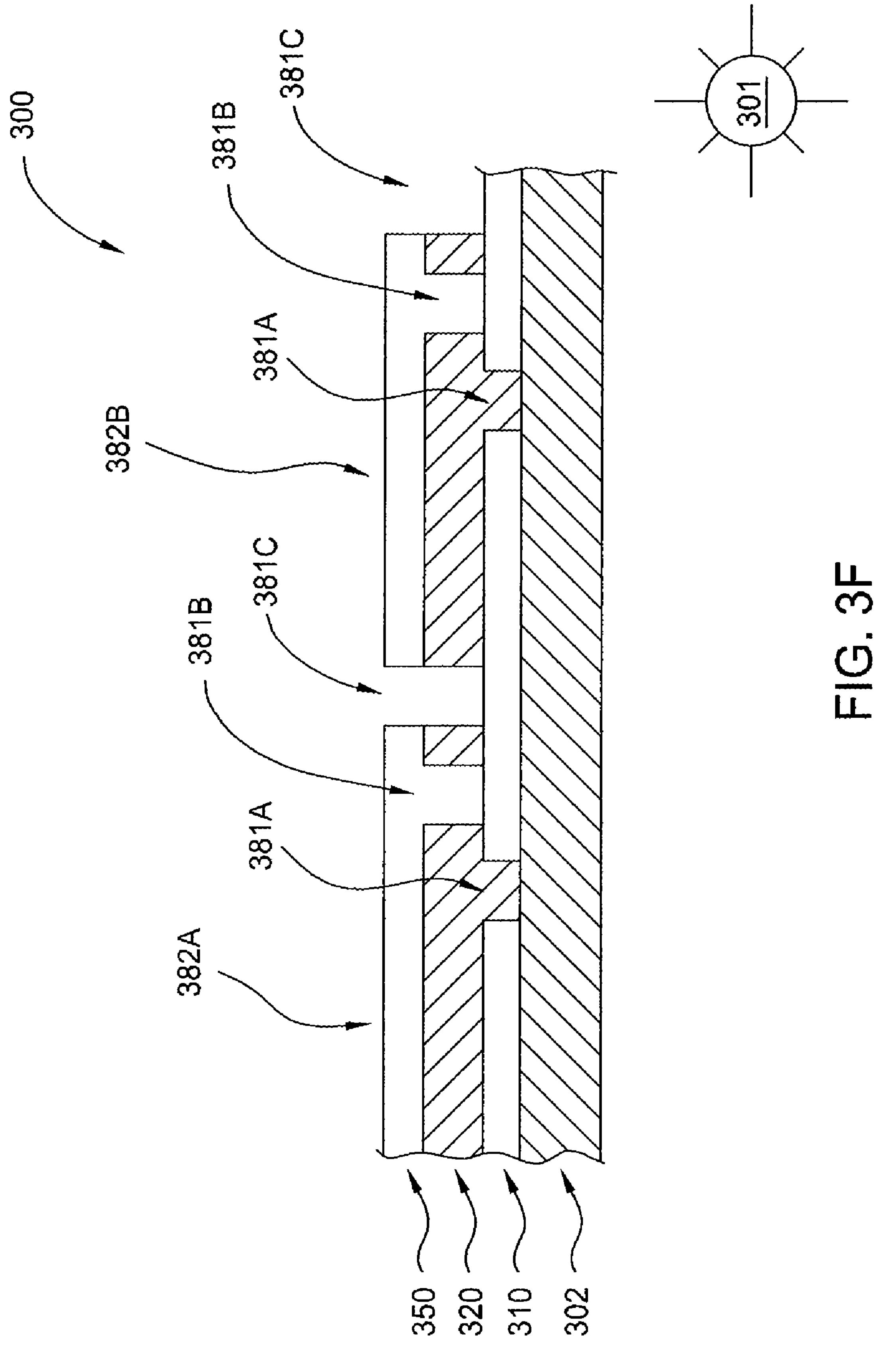
FIG. 3F is a side cross-sectional view of a thin film solar cell device according to one embodiment described herein.

FIG. 3F is a schematic cross-section of a solar cell 300 illustrating various scribed regions used to form the individual cells 382A-382B within the solar cell 300. As illustrated in FIG. 3F, the solar cell 300 includes a transparent substrate 302, a first TCO layer 310, a first p-i-n junction 320, and a back contact layer 350. Three laser scribing steps may be performed to produce trenches 381A, 381B, and 381C, which are generally required to form a high efficiency solar cell device. Although formed together on the substrate 302, the individual cells 382A and 382B are isolated from each other by the insulating trench 381C formed in the back contact layer 350 and the first p-i-n junction 320. In addition, the trench 381B is formed in the first p-i-n junction 320 so that the back contact layer 350 is in electrical contact with the first TCO layer 310. In one embodiment, the insulating trench 381A is formed by the laser scribe removal of a portion of the first TCO layer 310 prior to the deposition of the first p-i-n junction 320 and the back contact layer 350. Similarly, in one embodiment, the trench 381B is formed in the first p-i-n junction 320 by the laser scribe removal of a portion of the first p-i-n junction 320 prior to the deposition of the back contact layer 350. While a single junction type solar cell is illustrated in FIG. 3F this configuration is not intended to be limiting to the scope of the invention described herein.

General Solar Cell Formation Process Sequence

Referring to FIGS. 1 and 2, the process sequence 100 generally starts at step 102 in which a substrate 302 is loaded into the loading module 202 found in the solar cell production line 200. In one embodiment, the substrates 302 are received in a "raw" state where the edges, overall size, and/or cleanliness of the substrates 302 are not well controlled. Receiving "raw" substrates 302 reduces the cost to prepare and store substrates 302 prior to forming a solar device and thus reduces the solar cell device cost, facilities costs, and production costs of the finally formed solar cell device. However, typically, it is advantageous to receive "raw" substrates 302 that have a transparent conducting oxide (TCO) layer (e.g., first TCO layer 310) already deposited on a surface of the substrate 302 before it is received into the system in step 102. If a conductive layer, such as TCO layer, is not deposited on the surface of the "raw" substrates then a front contact deposition step (step 107), which is discussed below, needs to be performed on a surface of the substrate 302.

In one embodiment, the substrates 302 or 303 are loaded into the solar cell production line 200 in a sequential fashion, and thus do not use a cassette or batch style substrate loading system. A cassette style and/or batch loading type system that requires the substrates to be un-loaded from the cassette, processed, and then returned to the cassette before moving to the next step in the process sequence can be time consuming and decrease the solar cell production line throughput. The use of batch processing does not facilitate certain embodiments of the present invention, such as fabricating multiple solar cell devices from a single substrate. Additionally, the use of a batch style process sequence generally prevents the use of an asynchronous flow of substrates through the production line, which may provide improved substrate throughput during steady state processing and when one or more modules are brought down for maintenance or due to a fault condition. Generally, batch or cassette based schemes are not able to achieve the throughput of the production line described herein, when one or more processing modules are brought down for maintenance, or even during normal operation, since the queuing and loading of substrates can require a significant amount of overhead time.

In the next step, step 104, the surfaces of the substrate 302 are prepared to prevent yield issues later on in the process. In one embodiment of step 104, the substrate is inserted into a front end substrate seaming module 204 that is used to prepare the edges of the substrate 302 or 303 to reduce the likelihood of damage, such as chipping or particle generation from occurring during the subsequent processes. Damage to the substrate 302 or 303 can affect device yield and the cost to produce a usable solar cell device. In one embodiment, the front end substrate seaming module 204 is used to round or bevel the edges of the substrate 302 or 303. In one embodiment, a diamond impregnated belt or disc is used to grind the material from the edges of the substrate 302 or 303. In another embodiment, a grinding wheel, grit blasting, or laser ablation technique is used to remove the material from the edges of the substrate 302 or 303.

Next the substrate 302 or 303 is transported to the cleaning module 206, in which step 106, or a substrate cleaning step, is performed on the substrate 302 or 303 to remove any contaminants found on the surface of thereof. Common contaminants may include materials deposited on the substrate 302 or 303 during the substrate forming process (e.g., glass manufacturing process) and/or during shipping or storing of the substrates 302 or 303. Typically, the cleaning module 206 uses wet chemical scrubbing and rinsing steps to remove any undesirable contaminants.

In one example, the process of cleaning the substrate 302 or 303 may occur as follows. First, the substrate 302 or 303 enters a contaminant removal section of the cleaning module 206 from either a transfer table or an automation device 281. In general, the system controller 290 establishes the timing for each substrate 302 or 303 that enters the cleaning module 206. The contaminant removal section may utilize dry cylindrical brushes in conjunction with a vacuum system to dislodge and extract contaminants from the surface of the substrate 302. Next, a conveyor within the cleaning module 206 transfers the substrate 302 or 303 to a pre-rinse section, where spray tubes dispense hot DI water at a temperature, for example, of 50° C. from a DI water heater onto a surface of the substrate 302 or 303. Commonly, since the device substrate 303 has a TCO layer disposed thereon, and since TCO layers are generally electron absorbing materials, DI water is used to avoid any traces of possible contamination and ionizing of the TCO layer. Next, the rinsed substrate 302, 303 enters a wash section. In the wash section, the substrate 302 or 303 is wet-cleaned with a brush (e.g., perlon) and hot water. In some cases a detergent (e.g., Alconox™, Citrajet™, Detojet™, Transene™, and Basic H™), surfactant, pH adjusting agent, and other cleaning chemistries are used to clean and remove unwanted contaminants and particles from the substrate surface. A water re-circulation system recycles the hot water flow. Next, in a final rinse section of the cleaning module 206, the substrate 302 or 303 is rinsed with water at ambient temperature to remove any traces of contaminants. Finally, in a drying section, an air blower is used to dry the substrate 302 or 303 with hot air. In one configuration a deionization bar is used to remove the electrical charge from the substrate 302 or 303 at the completion of the drying process.

In the next step, or step 108, separate cells are electrically isolated from one another via scribing processes. Contamination particles on the TCO surface and/or on the bare glass surface can interfere with the scribing procedure. In laser scribing, for example, if the laser beam runs across a particle, it may be unable to scribe a continuous line, resulting in a short circuit between cells. In addition, any particulate debris present in the scribed pattern and/or on the TCO of the cells after scribing can cause shunting and non-uniformities between layers. Therefore, a well-defined and well-maintained process is generally needed to ensure that contamination is removed throughout the production process. In one embodiment, the cleaning module 206 is available from the Energy and Environment Solutions division of Applied Materials in Santa Clara, Calif.

Referring to FIGS. 1 and 2, in one embodiment, prior to performing step 108 the substrates 302 are transported to a front end processing module (not illustrated in FIG. 2) in which a front contact formation process, or step 107, is performed on the substrate 302. In one embodiment, the front end processing module is similar to the processing module 218 discussed below. In step 107, the one or more substrate front contact formation steps may include one or more preparation, etching, and/or material deposition steps to form the front contact regions on a bare solar cell substrate 302. In one embodiment, step 107 comprises one or more PVD steps that are used to form the front contact region on a surface of the substrate 302. In one embodiment, the front contact region contains a transparent conducting oxide (TCO) layer that may contain metal element selected from a group consisting of zinc (Zn), aluminum (Al), indium (In), and tin (Sn). In one example, a zinc oxide (ZnO) is used to form at least a portion of the front contact layer. In one embodiment, the front end processing module is an ATON™ PVD 5.7 tool available from Applied Materials in Santa Clara, Calif. in which one or more processing steps are performed to deposit the front contact region. In another embodiment, one or more CVD steps are used to form the front contact region on a surface of the substrate 302.

Next the device substrate 303 is transported to the scribe module 208 in which step 108, or a front contact isolation step, is performed on the device substrate 303 to electrically isolate different regions of the device substrate 303 surface from each other. In step 108, material is removed from the device substrate 303 surface by use of a material removal step, such as a laser ablation process. The success criteria for step 108 are to achieve good cell-to-cell and cell-to-edge isolation while minimizing the scribe area.

In one embodiment, a Nd:vanadate (Nd:$YVO_4$) laser source is used ablate material from the device substrate 303 surface to form lines that electrically isolate one region of the device substrate 303 from the next. In one embodiment, the laser scribe process performed during step 108 uses a 1064 nm wavelength pulsed laser to pattern the material disposed on the substrate 302 to isolate each of the individual cells (e.g., reference cells 382A and 382B) that make up the solar cell 300. In one embodiment, a 5.7 $m^2$ substrate laser scribe module available from Applied Materials, Inc. of Santa Clara, Calif. is used to provide simple reliable optics and substrate motion for accurate electrical isolation of regions of the device substrate 303 surface. In another embodiment, a water jet cutting tool or diamond scribe is used to isolate the various regions on the surface of the device substrate 303.

It may be desirable to assure that the temperature of the device substrates 303 entering the scribe module 208 are at a temperature in a range between about 20° C. and about 26° C. by use of an active temperature control hardware assembly that may contain a resistive heater and/or chiller components (e.g., heat exchanger, thermoelectric device). In one embodiment, it is desirable to control the device substrate 303 temperature to about 25+/−0.5° C.

Next the device substrate 303 is transported to the cleaning module 210 in which step 110, or a pre-deposition substrate cleaning step, is performed on the device substrate 303 to remove any contaminants found on the surface of the device substrate 303 after performing the cell isolation step (step 108). Typically, the cleaning module 210 uses wet chemical scrubbing and rinsing steps to remove any undesirable contaminants found on the device substrate 303 surface after performing the cell isolation step. In one embodiment, a cleaning process similar to the processes described in step 106 above is performed on the device substrate 303 to remove any contaminants on the surface(s) of the device substrate 303.

Next, the device substrate 303 is transported to the processing module 212 in which step 112, which comprises one or more photoabsorber deposition steps, is performed on the device substrate 303. In step 112, the one or more photoabsorber deposition steps may include one or more preparation, etching, and/or material deposition steps that are used to form the various regions of the solar cell device. Step 112 generally comprises a series of sub-processing steps that are used to form one or more p-i-n junctions. In one embodiment, the one or more p-i-n junctions comprise amorphous silicon and/or microcrystalline silicon materials. In general, the one or more processing steps are performed in one or more cluster tools (e.g., cluster tools 212A-212D) found in the processing module 212 to form one or more layers in the solar cell device formed on the device substrate 303. In one embodiment, the device substrate 303 is transferred to an accumulator 211A prior to being transferred to one or more of the cluster tools 212A-212D. In one embodiment, in cases where the solar cell device is formed to include multiple junctions, such as the tandem junction solar cell 300 illustrated in FIG. 3B, the cluster tool 212A in the processing module 212 is adapted to form the first p-i-n junction 320 and cluster tools 212B-212D are configured to form the second p-i-n junction 330.

In one embodiment of the process sequence 100, a cool down step, or step 113, is performed after step 112 has been performed. The cool down step is generally used to stabilize the temperature of the device substrate 303 to assure that the processing conditions seen by each device substrate 303 in the subsequent processing steps are repeatable. Generally, the temperature of the device substrate 303 exiting the processing module 212 could vary by many degrees Celsius and exceed a temperature of 50° C., which can cause variability in the subsequent processing steps and solar cell performance.

In one embodiment, the cool down step 113 is performed in one or more of the substrate supporting positions found in one or more accumulators 211. In one configuration of the production line, as shown in FIG. 2, the processed device substrates 303 may be positioned in one of the accumulators 211B for a desired period of time to control the temperature of the device substrate 303. In one embodiment, the system controller 290 is used to control the positioning, timing, and movement of the device substrates 303 through the accumulator(s) 211 to control the temperature of the device substrates 303 before proceeding down stream through the production line.

Next, the device substrate 303 is transported to the scribe module 214 in which step 114, or the interconnect formation step, is performed on the device substrate 303 to electrically isolate various regions of the device substrate 303 surface from each other. In step 114, material is removed from the device substrate 303 surface by use of a material removal step, such as a laser ablation process. In one embodiment, an Nd:vanadate (Nd:$YVO_4$) laser source is used ablate material from the substrate surface to form lines that electrically isolate one solar cell from the next. In one embodiment, a 5.7 $m^2$ substrate laser scribe module available from Applied Materials, Inc. is used to perform the accurate scribing process. In one embodiment, the laser scribe process performed during step 108 uses a 532 nm wavelength pulsed laser to pattern the material disposed on the device substrate 303 to isolate the individual cells that make up the solar cell 300. As shown in FIG. 3E, in one embodiment, the trench 381B is formed in the first p-i-n junction 320 layers by use of a laser scribing process. In another embodiment, a water jet cutting tool or diamond scribe is used to isolate the various regions on the surface of the solar cell.

It may be desirable to assure that the temperature of the device substrates 303 entering the scribe module 214 are at a temperature in a range between about 20° C. and about 26° C. by use of an active temperature control hardware assembly that may contain a resistive heater and/or chiller components (e.g., heat exchanger, thermoelectric device). In one embodiment, it is desirable to control the substrate temperature to about 25+/−0.5° C.

In one embodiment, the solar cell production line 200 has at least one accumulator 211 positioned after the scribe module(s) 214. During production accumulators 211C may be used to provide a ready supply of substrates to the processing module 218, and/or provide a collection area where substrates coming from the processing module 212 can be stored if the processing module 218 goes down or can not keep up with the throughput of the scribe module(s) 214. In one embodiment it is generally desirable to monitor and/or actively control the temperature of the substrates exiting the accumulators 211C to assure that the results of the back contact formation step 120 are repeatable. In one aspect, it is desirable to assure that the temperature of the substrates exiting the accumulators 211C or arriving at the processing module 218 are at a temperature in a range between about 20° C. and about 26° C. In one embodiment, it is desirable to control the substrate temperature to about 25+/−0.5° C. In one embodiment, it is desirable to position one or more accumulators 211C that are able to retain at least about 80 substrates.

Next, the device substrate 303 is transported to the processing module 218 in which one or more substrate back contact formation steps, or step 118, are performed on the device substrate 303. In step 118, the one or more substrate back contact formation steps may include one or more preparation, etching, and/or material deposition steps that are used to form the back contact regions of the solar cell device. In one embodiment, step 118 generally comprises one or more PVD steps that are used to form the back contact layer 350 on the surface of the device substrate 303. In one embodiment, the one or more PVD steps are used to form a back contact region that contains a metal layer selected from a group consisting of zinc (Zn), tin (Sn), aluminum (Al), copper (Cu), silver (Ag), nickel (Ni), and vanadium (V). In one example, a zinc oxide (ZnO) or nickel vanadium alloy (NiV) is used to form at least a portion of the back contact layer 305. In one embodiment, the one or more processing steps are performed using an ATON™ PVD 5.7 tool available from Applied Materials in Santa Clara, Calif. In another embodiment, one or more CVD steps are used to form the back contact layer 350 on the surface of the device substrate 303.

In one embodiment, the solar cell production line 200 has at least one accumulator 211 positioned after the processing module 218. During production, the accumulators 211D may be used to provide a ready supply of substrates to the scribe modules 220, and/or provide a collection area where substrates coming from the processing module 218 can be stored if the scribe modules 220 go down or can not keep up with the throughput of the processing module 218. In one embodiment it is generally desirable to monitor and/or actively control the temperature of the substrates exiting the accumulators 211D to assure that the results of the back contact formation step 120 are repeatable. In one aspect, it is desirable to assure that the temperature of the substrates exiting the accumulators 211D or arriving at the scribe module 220 are at a temperature in a range between about 20° C. and about 26° C. In one embodiment, it is desirable to control the substrate temperature to about 25+/−0.5° C. In one embodiment, it is desirable to position one or more accumulators 211C that are able to retain at least about 80 substrates.

Next, the device substrate 303 is transported to the scribe module 220 in which step 120, or a back contact isolation step, is performed on the device substrate 303 to electrically isolate the plurality of solar cells contained on the substrate surface from each other. In step 120, material is removed from the substrate surface by use of a material removal step, such as a laser ablation process. In one embodiment, a Nd:vanadate (Nd:$YVO_4$) laser source is used ablate material from the device substrate 303 surface to form lines that electrically isolate one solar cell from the next. In one embodiment, a 5.7 $m^2$ substrate laser scribe module, available from Applied Materials, Inc., is used to accurately scribe the desired regions of the device substrate 303. In one embodiment, the laser scribe process performed during step 120 uses a 532 nm wavelength pulsed laser to pattern the material disposed on the device substrate 303 to isolate the individual cells that make up the solar cell 300. As shown in FIG. 3E, in one embodiment, the trench 381C is formed in the first p-i-n junction 320 and back contact layer 350 by use of a laser scribing process.

It may be desirable to assure that the temperature of the device substrates 303 entering the scribe module 220 are at a temperature in a range between about 20° C. and about 26° C. by use of an active temperature control hardware assembly that may contain a resistive heater and/or chiller components (e.g., heat exchanger, thermoelectric device). In one embodiment, it is desirable to control the substrate temperature to about 25+/−0.5° C.

Next, the device substrate 303 is transported to the quality assurance module 222 in which step 122, or quality assurance and/or shunt removal steps, are performed on the device substrate 303 to assure that the devices formed on the substrate surface meet a desired quality standard and in some cases correct defects in the formed device. In step 122, a probing device is used to measure the quality and material properties of the formed solar cell device by use of one or more substrate contacting probes.

In one embodiment, the quality assurance module 222 projects a low level of light at the p-i-n junction(s) of the solar cell and uses the one more probes to measure the output of the cell to determine the electrical characteristics of the formed solar cell device(s). If the module detects a defect in the formed device, it can take corrective actions to fix the defects in the formed solar cells on the device substrate 303. In one embodiment, if a short or other similar defect is found, it may be desirable to create a reverse bias between regions on the substrate surface to control and or correct one or more of the defectively formed regions of the solar cell device. During the correction process the reverse bias generally delivers a voltage high enough to cause the defects in the solar cells to be corrected. In one example, if a short is found between supposedly isolated regions of the device substrate 303 the magnitude of the reverse bias may be raised to a level that causes the conductive elements in areas between the isolated regions to change phase, decompose, or become altered in some way to eliminate or reduce the magnitude of the electrical short.

In one embodiment of the process sequence 100, the quality assurance module 222 and factory automation system are used together to resolve quality issues found in a formed device substrate 303 during the quality assurance testing. In one case, a device substrate 303 may be sent back upstream in the processing sequence to allow one or more of the fabrication steps to be re-performed on the device substrate 303 (e.g., back contact isolation step (step 120)) to correct one or more quality issues with the processed device substrate 303.

Next, the device substrate 303 is optionally transported to the substrate sectioning module 224 in which a substrate sectioning step 124 is used to cut the device substrate 303 into a plurality of smaller device substrates 303 to form a plurality of smaller solar cell devices. In one embodiment of step 124, the device substrate 303 is inserted into substrate sectioning module 224 that uses a CNC glass cutting tool to accurately cut and section the device substrate 303 to form solar cell devices that are a desired size. In one embodiment, the device substrate 303 is inserted into the sectioning module 224 that uses a glass scribing tool to accurately score the surface of the device substrate 303. The device substrate 303 is then broken along the scored lines to produce the desired size and number of sections needed for the completion of the solar cell devices.

In one embodiment, steps 102-122 can be configured to use equipment that is adapted to perform process steps on large device substrates 303, such as 2200 mm×2600 mm×3 mm glass device substrates 303, and steps 124 onward can be adapted to fabricate various smaller sized solar cell devices with no additional equipment required. In another embodiment, step 124 is positioned in the process sequence 100 prior to step 122 so that the initially large device substrate 303 can be sectioned to form multiple individual solar cells that are then tested and characterized one at a time or as a group (i.e., two or more at a time). In this case, steps 102-121 are configured to use equipment that is adapted to perform process steps on large device substrates 303, such as 2200 mm×2600 mm×3 mm glass substrates, and steps 124 and 122 onward are adapted to fabricate various smaller sized modules with no additional equipment required.

Referring back to FIGS. 1 and 2, the device substrate 303 is next transported to the seamer/edge deletion module 226 in which a substrate surface and edge preparation step 126 is used to prepare various surfaces of the device substrate 303 to prevent yield issues later on in the process. In one embodiment of step 126, the device substrate 303 is inserted into seamer/edge deletion module 226 to prepare the edges of the device substrate 303 to shape and prepare the edges of the device substrate 303. Damage to the device substrate 303 edge can affect the device yield and the cost to produce a usable solar cell device. In another embodiment, the seamer/edge deletion module 226 is used to remove deposited material from the edge of the device substrate 303 (e.g., 10 mm) to provide a region that can be used to form a reliable seal between the device substrate 303 and the backside glass (i.e., steps 134-136 discussed below). Material removal from the edge of the device substrate 303 may also be useful to prevent electrical shorts in the final formed solar cell.

In one embodiment, a grinding wheel is used to grind the deposited material from the edge regions of the device substrate 303. In another embodiment, dual grinding wheels are used to remove the deposited material from the edge of the device substrate 303. In yet another embodiment, grit blasting or laser ablation techniques are used to remove the deposited material from the edge of the device substrate 303. In one aspect, the seamer/edge deletion module 226 is used to round or bevel the edges of the device substrate 303 by use of shaped grinding wheels, angled and aligned belt sanders, and/or abrasive wheels.

Next the device substrate 303 is transported to the pre-screen module 228 in which optional pre-screen steps 128 are performed on the device substrate 303 to assure that the devices formed on the substrate surface meet a desired quality standard. In step 128, a light emitting source and probing device are used to measure the output of the formed solar cell device by use of one or more substrate contacting probes. If the module 228 detects a defect in the formed device it can take corrective actions or the solar cell can be scrapped.

Next the device substrate 303 is transported to the cleaning module 230 in which step 130, or a pre-lamination substrate cleaning step, is performed on the device substrate 303 to remove any contaminants found on the surface of the substrates 303 after performing steps 122-128. Typically, the cleaning module 230 uses wet chemical scrubbing and rinsing steps to remove any undesirable contaminants found on the substrate surface after performing the cell isolation step. In one embodiment, a cleaning process similar to the processes described in step 106 is performed on the substrate 303 to remove any contaminants on the surface(s) of the substrate 303.

Next the substrate 303 is transported to a bonding wire attach module 231 in which step 131, or a bonding wire attach step, is performed on the substrate 303. Step 131 is used to attach the various wires/leads required to connect the various external electrical components to the formed solar cell device. Typically, the bonding wire attach module 231 is an automated wire bonding tool that reliably and quickly forms the numerous interconnects that are often required to form the large solar cells formed in the production line 200.

In one embodiment, the bonding wire attach module 231 is used to form the side-buss 355 (FIG. 3C) and cross-buss 356 on the formed back contact region (step 118). In this configuration the side-buss 355 may be a conductive material that can be affixed, bonded, and/or fused to the back contact layer 350 found in the back contact region to form a good electrical contact. In one embodiment, the side-buss 355 and cross-buss 356 each comprise a metal strip, such as copper tape, a nickel coated silver ribbon, a silver coated nickel ribbon, a tin coated copper ribbon, a nickel coated copper ribbon, or other conductive material that can carry the current delivered by the solar cell and be reliably bonded to the metal layer in the back contact region. In one embodiment, the metal strip is between about 2 mm and about 10 mm wide and between about 1 mm and about 3 mm thick.

The cross-buss 356, which is electrically connected to the side-buss 355 at the junctions, can be electrically isolated from the back contact layer(s) of the solar cell by use of an insulating material 357, such as an insulating tape. The ends of each of the cross-busses 356 generally have one or more leads 362 that are used to connect the side-buss 355 and the cross-buss 356 to the electrical connections found in a junction box 370, which is used to connect the formed solar cell to the other external electrical components.

In the next step, step 132, a bonding material 360 (FIG. 3E) and "back glass" substrate 361 are prepared for delivery into the solar cell formation process (i.e., process sequence 100). The preparation process is performed in the glass lay-up module 232, which comprises a material preparation module 232A, a glass loading module 232B, and a glass cleaning module 232C. The back glass substrate 361 is bonded onto the device substrate 303 formed in steps 102-130 above by use of a laminating process (step 134 discussed below). In one embodiment of step 132, a polymeric material is prepared to be placed between the back glass substrate 361 and the deposited layers on the device substrate 303 to form a hermetic seal to prevent the environment from attacking the solar cell during its life.

Referring to FIG. 2, step 132 comprises a series of sub-steps in which a bonding material 360 is prepared in the material preparation module 232A, the bonding material 360 is then placed over the device substrate 303, the back glass substrate 361 is loaded into the loading module 232B and washed by the cleaning module 232C, and the back glass substrate 361 is then placed over the bonding material 360 and the device substrate 303.

In one embodiment, the material preparation module 232A is adapted to receive the bonding material 360 in a sheet form and perform one or more cutting operations to provide a bonding material, such as Polyvinyl Butyral (PVB) or Ethylene Vinyl Acetate (EVA) sized to form a reliable seal between the backside glass and the solar cells formed on the device substrate 303. In general, when using bonding materials 360 that are polymeric, it is desirable to control the temperature (e.g., 16-18° C.) and relative humidity (e.g., RH 20-22%) of the solar cell production line 200 where the bonding material 360 is stored and integrated into the solar cell device to assure that the attributes of the bond formed in the bonding module 234 are repeatable and the dimensions of the polymeric material are stable. It is generally desirable to store the bonding material prior to use in temperature and humidity controlled area (e.g., T=6-8° C.; RH=20-22%).

The tolerance stack up of the various components in the bonded device (Step 134) can be an issue when forming large solar cells. Therefore, accurate control of the bonding material properties and tolerances of the cutting process assure that a reliable hermetic seal is formed. In one embodiment, PVB may be used to advantage due to its UV stability, moisture resistance, thermal cycling, good US fire rating, compliance with Intl Building Code, low cost, and reworkable thermoplastic properties.

In one part of step 132, the bonding material 360 is transported and positioned over the back contact layer 350, the side-buss 355 (FIG. 3C), and the cross-buss 356 (FIG. 3C) elements of the device substrate 303 using an automated robotic device. The device substrate 303 and bonding material 360 are then positioned to receive a back glass substrate 361, which can be placed thereon by use of the same automated robotic device used to position the bonding material 360, or a second automated robotic device.

In one embodiment, prior to positioning the back glass substrate 361 over the bonding material 360, one or more preparation steps are performed to the back glass substrate 361 to assure that subsequent sealing processes and final solar product are desirably formed. In one case, the back glass substrate 361 is received in a "raw" state where the edges, overall size, and/or cleanliness of the substrate 361 are not well controlled. Receiving "raw" substrates reduces the cost to prepare and store substrates prior to forming a solar device and thus reduces the solar cell device cost, facilities costs, and production costs of the finally formed solar cell device. In one embodiment of step 132, the back glass substrate 361 surfaces and edges are prepared in a seaming module (e.g., seaming module 204) prior to performing the back glass substrate cleaning step. In the next sub-step of step 132, the back glass substrate 361 is transported to the cleaning module 232C in which a substrate cleaning step is performed on the substrate 361 to remove any contaminants found on the surface of the substrate 361. Common contaminants may include materials deposited on the substrate 361 during the substrate forming process (e.g., glass manufacturing process) and/or during shipping of the substrates 361. Typically, the cleaning module 232C uses wet chemical scrubbing and rinsing steps to remove any undesirable contaminants as discussed above. The prepared back glass substrate 361 is then positioned over the bonding material and the device substrate 303 by use of an automated robotic device.

Next the device substrate 303, the back glass substrate 361, and the bonding material 360 are transported to the bonding module 234 in which step 134, or lamination steps are performed to bond the backside glass substrate 361 to the device substrate formed in steps 102-130 discussed above. In step 134, a bonding material 360, such as Polyvinyl Butyral (PVB) or Ethylene Vinyl Acetate (EVA), is sandwiched between the backside glass substrate 361 and the device substrate 303. Heat and pressure are applied to the structure to form a bonded and sealed device using various heating elements and other devices found in the bonding module 234. The device substrate 303, the back glass substrate 361, and the bonding material 360 thus form a composite solar cell structure 304 (FIG. 3D) that at least partially encapsulates the active regions of the solar cell device. In one embodiment, at least one hole formed in the back glass substrate 361 remains at least partially uncovered by the bonding material 360 to allow portions of the cross-buss 356 or the side buss 355 to remain exposed so that electrical connections can be made to these regions of the solar cell structure 304 in future steps (i.e., step 138).

Next the composite solar cell structure 304 is transported to the autoclave module 236 in which step 136, or autoclave steps are performed on the composite solar cell structure 304 to remove trapped gasses in the bonded structure and assure that a good bond is formed during step 134. In step 134, a bonded solar cell structure 304 is inserted in the processing region of the autoclave module where heat and high pressure gases are delivered to reduce the amount of trapped gas and improve the properties of the bond between the device substrate 303, back glass substrate, and bonding material 360. The processes performed in the autoclave are also useful to assure that the stress in the glass and bonding layer (e.g., PVB layer) are more controlled to prevent future failures of the hermetic seal or failure of the glass due to the stress induced during the bonding/lamination process. In one embodiment, it may be desirable to heat the device substrate 303, back glass substrate 361, and bonding material 360 to a temperature that causes stress relaxation in one or more of the components in the formed solar cell structure 304.

Next, the composite solar cell structure 304 is transported to the junction box attachment module 238 in which a junction box attachment step 138 is performed on the composite solar cell structure 304. The junction box attachment module 238, used during step 138, is used to install a junction box 370 (FIG. 3D) on the composite solar cell structure 304. The installed junction box 370 acts as an interface between the external electrical components that will connect to the formed solar cell, such as other solar cells or a power grid, and the internal electrical connections points, such as the leads 362, formed during step 131. In one embodiment, the junction box 370 contains one or more junction box terminals 371, 372 so that the formed solar cell can be easily and systematically connected to other external devices to deliver the generated electrical power. A more detailed description of an exemplary junction box attachment module 226 and an exemplary processing sequence 480 for attaching the junction box 370 to the composite solar cell structure 304 is presented below in the section entitled, "Junction Box Attachment Module and Processes."

Next the solar cell structure 304 is transported to the device testing module 240 in which device screening and analysis steps 140 are performed on the solar cell structure 304 to assure that the devices formed on the solar cell structure 304 surface meet desired quality standards. In one embodiment, the device testing module 240 is a solar simulator module that is used to qualify and test the output of the one or more formed solar cells. In step 140, a light emitting source and probing device are used to measure the output of the formed solar cell device by use of one or more automated components adapted to make electrical contact with terminals in the junction box 370. If the module detects a defect in the formed device it can take corrective actions or the solar cell can be scrapped.

Next the solar cell structure 304 is transported to the support structure module 241 in which support structure mounting steps 141 are performed on the solar cell structure 304 to provide a complete solar cell device that has one or more mounting elements attached to the solar cell structure 304 formed using steps 102-140 to a complete solar cell device that can easily be mounted and rapidly installed at a customer's site.

Next the solar cell structure 304 is transported to the unload module 242 in which step 142, or device unload steps are performed on the substrate to remove the formed solar cells from the solar cell production line 200.

In one embodiment of the solar cell production line 200, one or more regions in the production line are positioned in a clean room environment to reduce or prevent contamination from affecting the solar cell device yield and useable lifetime. In one embodiment, as shown in FIG. 2, a class 10,000 clean room space 250 is placed around the modules used to perform steps 108-118 and steps 130-134.

Junction Box Attachment Module and Process

The junction box attachment module 238 and processing sequence 500, performed during step 138, are used to install a junction box 370 (FIG. 3D) on a partially formed solar cell (FIG. 3C). The installed junction box 370 acts as an interface between the external electrical components that will connect to the formed solar cell, such as other solar cells or a power grid, and the internal electrical connections points, such as the leads 362 of the cross-buss 356, formed during step 131. In one embodiment, the junction box 370 includes one or more connection points (e.g., reference numerals 371, 372 in FIG. 3D) so that the formed solar cell can be easily and systematically connected to other external devices to deliver the generated electrical power. An exemplary junction box attachment module 238 and method of using the same are described in U.S. Provisional Patent Application Ser. No. 61/023,810, filed Jan. 25, 2008, which is herein incorporated by reference.

Figure 4A:
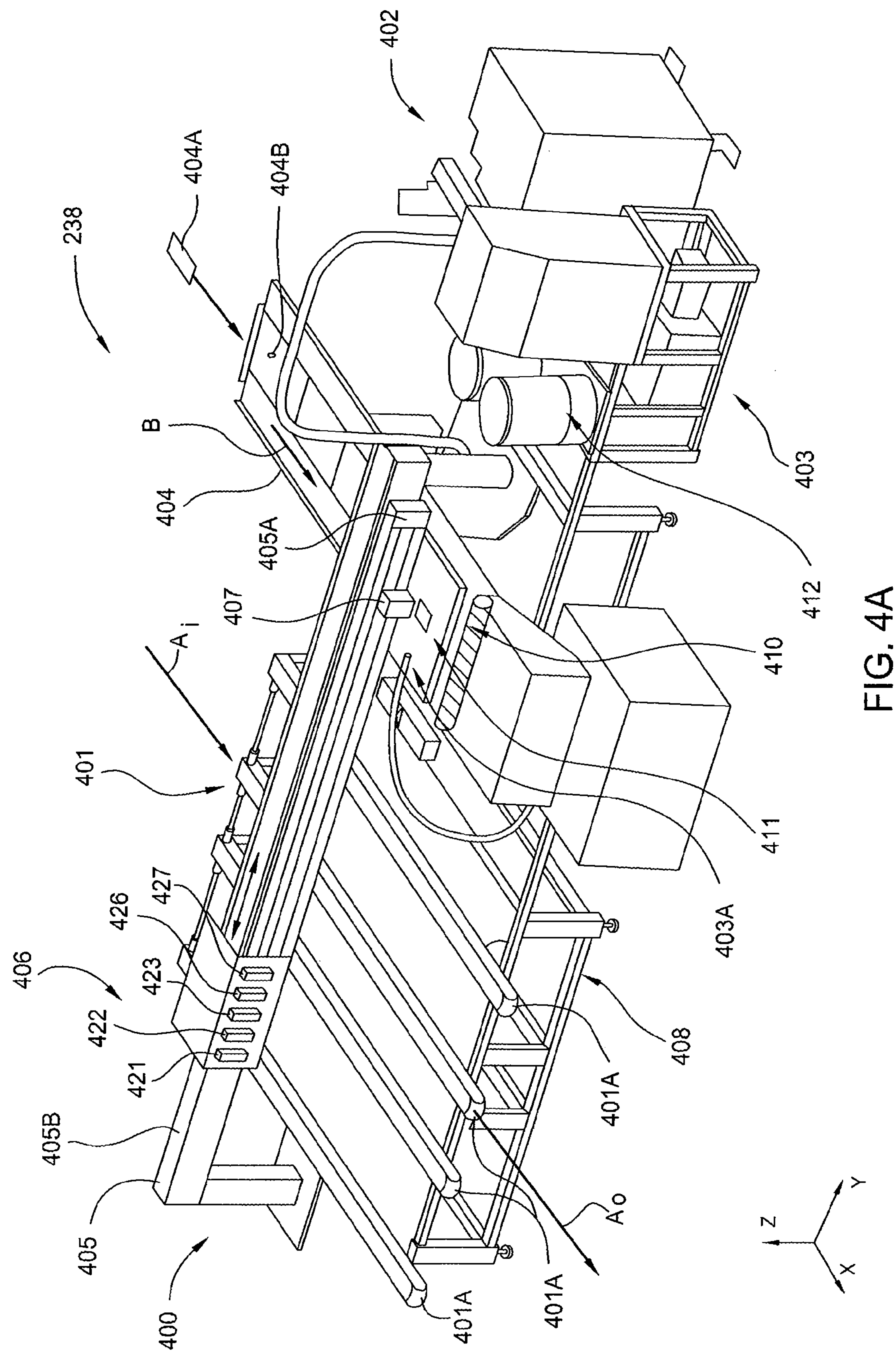
FIG. 4A is a schematic isometric view of a junction box attachment module according to one embodiment described herein.

FIG. 4A illustrates an embodiment of a junction box attachment module 238 which may be useful to perform the processing sequence 500, discussed below. FIG. 4A is an isometric view of one embodiment of the junction box attachment module 238 that illustrates some of the common components found within this module. In one embodiment, the junction box attachment module 238 includes a main structure 400, an adhesive dispense assembly 402, a potting material dispense assembly 403, a junction box conveyor assembly 404, a gantry system 405, a head assembly 406, a flux dispense assembly 412, and a conveyor system 401. The main structure 400 may include a support truss, or support structure 408, that is adapted to support and retain the various components used to perform the processing sequence 500. In one embodiment, the conveyor system 401 includes a plurality of conventional conveyor belts 401A that are mounted to the support structure 408 to allow the composite solar cell structure 304 to be positioned and transferred through the junction box attachment module 238. As shown in FIG. 4A, the composite solar cell structure 304 can be transferred into the junction box attachment module 238 following path $A_i$ and exit the junction box attachment module 238 following path $A_o$.

In one embodiment, the gantry system 405, which is also supported by the support structure 408, includes structural components 405B and automation hardware that is used to move and position the head assembly 406 over the composite solar cell structure 304 that is positioned on the conveyor system 401. The gantry system 405 may include an actuator 405A, such as a servomotor controlled belt and pulley system, that is adapted to controllably position the head assembly 406 over the composite solar cell structure 304. In one embodiment, the positioning of the head assembly 406 is controlled via the system controller 290.

In one embodiment, the junction box conveyor assembly 404 is configured to receive one or more junction box components, such as junction boxes 370 and junction box lids 370A, from an operator, or an automated supply device 404A, and deliver them to a receiving region 411 of the junction box attachment module 238 in an automated fashion. Once the one or more junction box components are positioned in the receiving region 411, the head assembly 406 may receive, remove, and place these components onto the composite solar cell structure 304 positioned on the conveyor system 401. In one embodiment, the junction box conveyor assembly 404 is adapted to receive a tray 410 of junction box components from the supply device 404A and move the tray 410 (along path "B") to the receiving region 411 using a conveyor 404B. The conveyor 404B may be adapted to move and position the components received from the supply device 404A through commands sent from the system controller 290.

In one embodiment, the gantry system 405 includes a robotic arm assembly 407. The robotic arm assembly 407 may be configured to pickup a junction box 370 from the tray 410 positioned in the receiving region 411 and move the junction box 370 into a position for dispensing adhesive and/or flux, as discussed below.

In one embodiment, the adhesive dispense assembly 402 includes components adapted to deliver an adhesive, such as a hot melt room temperature vulcanizing (RTV) adhesive, to a section of the junction box attachment module 238, such as a nozzle in the dispense head assembly 403A, where the adhesive can be disposed upon a sealant receiving surface of the junction box 370. In one embodiment, the adhesive dispense assembly 402 is automated and is adapted to heat and dispense the adhesive material using resistive heating elements and a pressurized fluid delivery system. The pressurized fluid delivery system may use pressurized gas or other mechanical means to deliver the heated adhesive to the dispense head assembly 403A the junction box 370. The accurate and automatic dispensing of the adhesive material improves device yield, reduces labor, reduces material cost per formed device, and makes the process results more repeatable.

In one embodiment, the flux dispense assembly 412 includes components adapted to deliver a flux material to a section of the junction box attachment module 238, such as a nozzle in the dispense head assembly 403A, where the flux material is dispensed onto the electrical connections 354 (FIG. 3D) in the junction box 370 and the leads 362 of the cross-buss 356 (FIG. 3C) to improve the wetting of the solder material during step 510, discussed below. In one embodiment, the flux material is used to facilitate a lower resistance and stronger solder bond between the electrical connections 345 and the leads 362.

In one embodiment, the potting material dispense assembly 403 includes components adapted to deliver a potting material, such as a two part RTV material, to an internal region 365 (FIG. 3D) of the junction box 370 using a dispense nozzle 427 that has been accurately positioned over the junction box 370 and composite solar cell structure 304 by use of the gantry system 405 and commands sent from the system controller 290. In one embodiment, the internal region 365 of the junction box 370 is formed after the junction box 370 has been sealably mounted to the composite solar cell structure 304. In one embodiment, a desired amount of each of the two parts of potting material are simultaneously delivered to the internal region 365 of the junction box 370 by use of the system controller 290. In one embodiment, the two parts of the potting material are mixed prior to dispensing through the dispense nozzle 427. The potting material may be used to isolate the active regions of the composite solar cell structure 304 and the electrical connections 354, located in the junction box 370, from environmental attack during the usable life of the formed solar cell device 300. The accurate positioning and controlled dispensing of the potting material in an automated manner may improve device yield, reduce labor and material cost per formed device, and make the process results more repeatable.

Figure 4B:
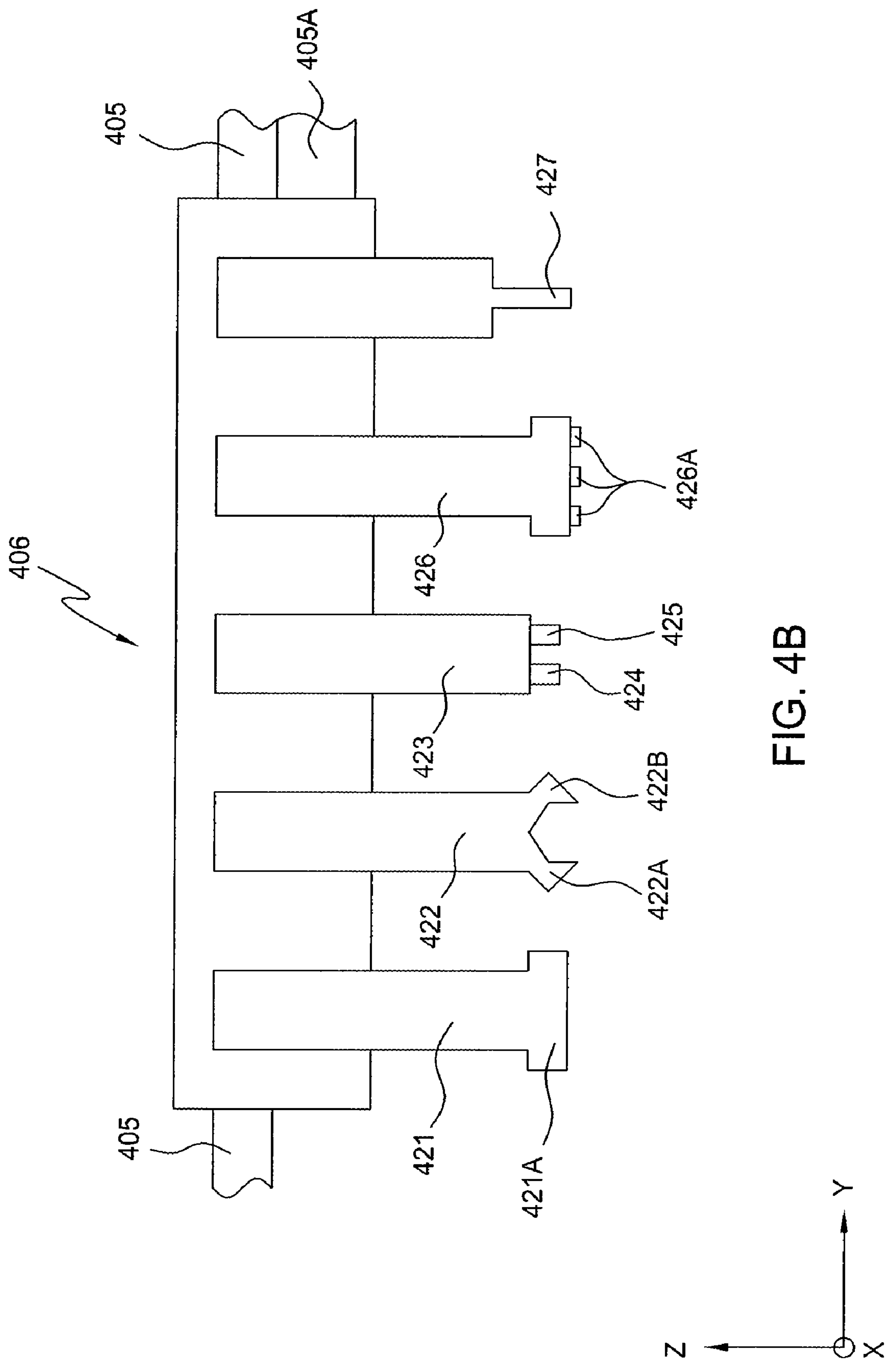
FIG. 4B is a front schematic view of on embodiment of the assembly head depicted in FIG. 4A.

FIG. 4B is an enlarged, schematic, front view of the head assembly 406 depicted in FIG. 4A. In one embodiment, the head assembly 406 includes a vision system 421, a robotic gripper 422, a thermode assembly 423, a lid retrieving robot 426, and the dispense nozzle 427. As noted above, in one embodiment, the head assembly 406 may be positioned in a desired position along the length of the gantry system 405 using an actuator 405A and the system controller 290. In one embodiment, the vision system 421 and the system controller 290 are adapted to locate one or more features on a composite solar cell structure 304 by scanning a camera 421A disposed in the vision system 421 across the composite solar cell structure 304 as the gantry system 405 moves the head assembly 406 (y-direction motion) and as the conveyor system 401 moves the composite solar cell structure 304 (x-direction motion).

In one embodiment, the vision system 421 generally includes a camera 421A and other electronic components that are able to locate, communicate, and store the position of features found within the formed composite solar cell structure 304. For example, the vision system 421 may be used to find the position of the exposed leads 362 of the cross-buss 356 and the opening 363 found in the back glass substrate 361 of the composite solar cell structure 304 (FIG. 3C).

Once the desirable features on the composite solar cell substrate 304 are located by the vision system 421, a junction box 370 that has been received by the robotic gripper 422 may be positioned on the composite solar cell structure 304, and electrical connections between the junction box 370 and the composite solar cell structure 304 may be reliably made (step 510 discussed below). In one embodiment, the robotic gripper 422 includes robotic gripping components that are adapted to receive, retain and position the junction box 370.

In one embodiment, the robotic gripper 422 includes gripping elements 422A, 422B adapted to mate with two or more datum surfaces 358 (FIG. 3D) located on the junction box 370. In one embodiment, the robotic gripper 422 is mounted on the head assembly 406 to pickup the junction box 370 from the robotic arm 407 and accurately place the junction box 370, using the datum surfaces 358, from commands sent by the system controller 290 based on positional information received by the vision system 421. In one embodiment, the robotic gripper 422 is configured to rotationally manipulate the junction box 370 with respect to the composite solar cell structure 304 to properly angularly orient the junction box 370 according to the size, orientation, and location of the composite solar cell structure 304 as detected by the vision system 421.

In one embodiment, the thermode assembly 423 includes two or more thermal devices that are used to deliver heat to form a good electrical connection between the leads 362 of the cross-buss 356 (FIG. 3C) and the electrical connections 354 located in the junction box 370 (FIG. 3D). In operation, the thermode assembly 423 and the composite solar cell structure 304 are positioned so that the electrical connections 354 in the junction box 370 receive enough heat to cause any solder and/or flux material, disposed on the electrical connections 354 and/or the leads 362 to melt and form a robust electrical connection. In another embodiment, the thermode 423 may be adapted to deliver a flux material to the junction between the electrical connection 354 and the leads 362 to improve the wetting of the solder material during the formation of solder joints. In one embodiment, the thermode 423 includes two elements 424, 425, such as resistive heating elements, adapted to simultaneously form an electrical connection between the two electrical connections 354 (FIG. 3D) and the two leads 362 (FIG. 3C). In one embodiment, the thermode assembly 423 includes a temperature sensor and a controller to ensure that the proper temperature is achieved for consistently creating the electrical connection between the composite solar cell structure leads 362 and the junction box electrical connections 354. In one embodiment, the thermode assembly 423 is electrically grounded to dissipate any electrical energy that may be present in the composite solar cell structure 304.

In one embodiment, the lid retrieving robot 426 is adapted to receive the junction box lid 370A from the receiving region 411 and position it over the junction box 370 after all of the electrical connections have been made and the potting material has been positioned within the internal region 365 of the junction box 370. The lid retrieving robot 426 may include one or more vacuum end-effectors 426A that are adapted to receive and hold the junction box lid 370A as the lid receiving robot 426 is maneuvered over the junction box 370 via the head assembly 406, the gantry 405, and the system controller 290. In one embodiment, the lid retrieving robot 426 is configured to rotationally align the junction box lid 370A with respect to the composite solar cell structure 304 to properly angularly orient the junction box lid 370A with respect to the placement of the junction box 370.

Figure 5:
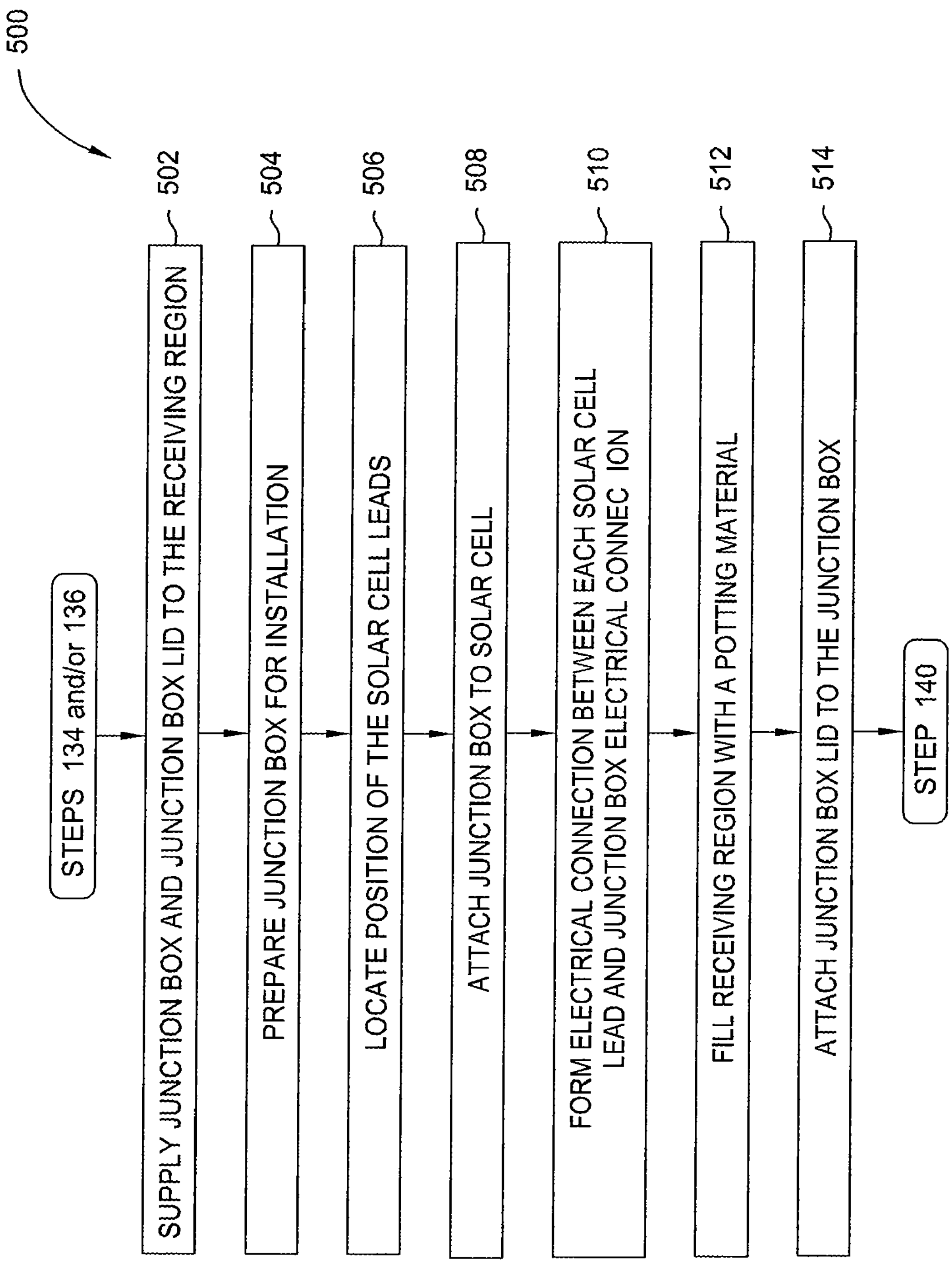
FIG. 5 illustrates a processing sequence according to one embodiment described herein.

Referring to FIGS. 1, 4A, and 5, in step 138, a processing sequence 500 is used to complete the junction box attachment process. As discussed above, embodiments of the invention may include a method and a device for forming external connection points on a solar cell so that the formed solar cell can be easily and systematically connected to other external devices, such as other solar cells or a power grid, to generate electrical power. FIG. 5 illustrates one embodiment of a process sequence 500 that includes a plurality of steps (i.e., steps 502-514) that are used to form an electrical connection to a solar cell device. The configuration, number of processing steps, and order of the processing steps in the process sequence 500 are not intended to be limiting to the scope of the invention described herein.

In one embodiment, the process sequence 500 generally starts at step 502 in which one or more junction boxes 370 and/or one or more junction box lids 370A are moved to the receiving region 411 of the junction box attachment module 238 using the conveyor assembly 404, discussed above.

In step 504, the junction box 370 is prepared for installation on the composite solar cell structure 304 that has been processed up through steps 134 and/or 136 of the process sequence 100, discussed above. During step 504 an adhesive material, such as a hot melt RTV adhesive, is disposed on a sealant receiving surface of the junction box 370. In one embodiment, the robotic arm 407 receives the junction box 370 from the tray 410 positioned in the receiving region 411 and moves the junction box 370 to the dispense head assembly 403A, which dispenses the adhesive on the sealant surface of the junction box 370. In one embodiment of step 504, a flux material may be applied to each of the electrical connections 354 via the dispense head assembly 403A as well.

In step 506, the vision system 421 in conjunction with the gantry assembly 405, head assembly 406, conveyor system 401, and system controller 290 scans the composite solar cell structure 304 to locate the leads 362 of the cross-buss 356 and the opening 363 formed in the back glass substrate 361. In one embodiment, a camera 421A within the vision system 421 and memory storage within the system controller 290 are used to automatically locate and store the position of the leads 362 and the opening 363 so that the other robotic components in the junction box attachment module 238 can reliably perform the remaining attachment steps.

In step 508, the junction box 370 is disposed on the composite solar cell structure 304, which is positioned on the conveyor system 401 so that the adhesive material found on the sealant receiving surface can form a seal around the opening 363 contained in the back glass substrate 361. In one embodiment, during step 508 the junction box 370 is picked-up by the robotic gripper 422 from the arm 407, and accurately oriented and positioned over the leads 362 of the cross-buss 356 and the opening 363 by use of the information received by the vision system 421 during step 506. In one embodiment, the gripping components 422A, 422B of the robotic gripper 422 are adapted to receive the datum surfaces 358 on the junction box 370 to provide for the correct alignment and orientation of the junction box 370 with respect to the leads 362 and the opening 363. In one embodiment, the robotic gripper 422 is configured to rotationally align the junction box 370 with respect to the composite solar cell structure 304 at a variety of angular positions as dictated by the size, location, and orientation of the composite solar cell structure 304. In one embodiment, the robotic gripper 422 is adapted to urge the junction box 370 and adhesive material against the surface of the back glass substrate 361 during installation. The urging force may be sufficient to obtain an even spread of adhesive material as well as obtain good contact between the leads 362 and the electrical connections 454. In one embodiment, to prevent damage to the composite solar cell substrate 304, a support platform (not shown) may be provided to support and engage one or more regions of the composite solar cell structure 304 while the robotic gripper

422 urges the junction box 370 and adhesive material against the surface of the back glass substrate 361.

In step 510, the thermode assembly 423 is positioned (X, Y and Z directions) to deliver heat to the leads 362 of the cross-buss 356 and the electrical connections 354 in the junction box 370 to form a robust electrical connection. In one embodiment, the heating elements 424, 425 of the thermode assembly 423 simultaneously cause the solder material and/or flux found on the leads 362 and/or electrical connections 354 to melt and form a reliable and robust electrical connection between the junction box 370 and the composite solar cell structure 304. In one embodiment, the electrical connections are electrically probed to ensure continuity between the leads 362 and the electrical connections 354.

In step 512, the internal region 365 of the junction box 370 is filled with a desired amount of a potting material by use of the dispense nozzle 427 disposed on the head assembly 406, the gantry system 405, conveyor system 401, and the system controller 290. The potting material, such as a polymeric material, is generally used to isolate active regions of the solar cell and the electrical connections formed during step 510 from environmental attack during the life of the formed solar cell device.

In step 514, the junction box lid 307A is placed on the junction box 370 so that the internal region 365 of the junction box 370 can be further isolated from the external environment. In one embodiment, the lid retrieving robot 426 is configured to rotationally align the junction box lid 370A with respect to the composite solar cell structure 304 to properly angularly orient the junction box lid 370A with respect to the placement of the junction box 370. In one embodiment, the junction box terminals 371, 372 are electrically probed to ensure continuity between the composite solar structure leads 362 and the junction box electrical connections 354. After completion of this process sequence 500 the solar cell device is transferred to the device testing module 240 where step 140 can be performed.

While the foregoing is directed to embodiments of the present invention, other and further embodiments of the invention may be devised without departing from the basic scope thereof, and the scope thereof is determined by the claims that follow.

The invention claimed is:

1. A solar cell electrical connection module, comprising:

a receiving region configured to receive a junction box;

a robotic arm disposed adjacent the receiving region and configured to hold and manipulate the junction box;

an adhesive dispense assembly configured to apply an adhesive to a sealant surface of the junction box;

a vision system configured to scan a solar cell device and locate positional features on the solar cell device;

a robotic gripper having gripping elements configured to pick up, manipulate, and place the junction box assembly onto the solar cell device;

a heating element configured to create an electrical connection between the junction box and the solar cell device; and a system controller configured to receive signals describing the location of the positional features from the vision system and send command signals based on the received signals to position the robotic gripper and the heating element using an actuator.

2. The module of claim 1, further comprising a solar cell device conveyor disposed beneath the robotic gripper configured to move the solar cell device in a first direction.

3. The module of claim 2, wherein the actuator is attached to the robotic gripper and configured to move the robotic gripper in a second direction, wherein the second direction is substantially perpendicular to the first direction.

4. The module of claim 3, further comprising a flux dispensing assembly having a nozzle configured to apply flux to electrical connection tabs on the junction box.

5. The module of claim 3, further comprising a potting material dispense assembly having a nozzle configured to apply a polymeric material around the electrical connection.

6. The module of claim 5, wherein the actuator is attached to the vision system, and wherein the actuator is attached to the potting dispense assembly.

7. The module of claim 6, further comprising a junction box conveyor disposed adjacent the receiving region and configured to deliver the junction box from an outside source to the receiving region.

8. The module of claim 7, wherein adhesive dispense assembly comprises a nozzle disposed adjacent the robotic arm, and wherein the nozzle is positioned to apply the adhesive to the junction box while the robotic arm holds the junction box.

9. The module of claim 8, wherein the system controller is configured to send signals to the actuator to position the robotic gripper with respect to the positional features of the solar cell device.

* * * * *